United States Patent
Chiou et al.

(10) Patent No.: US 10,244,644 B2
(45) Date of Patent: Mar. 26, 2019

(54) AUTOMOTIVE ELECTRONIC DEVICE HAVING A COVER WITH FINS TO REDUCE GEL VIBRATION

(71) Applicant: Continental Automotive Systems, Inc., Auburn Hills, MI (US)

(72) Inventors: Jen-Huang Albert Chiou, Libertyville, IL (US); David Manfredi, Arlington Heights, IL (US); Daniel J. Bratek, Arlington Heights, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/959,345

(22) Filed: Dec. 4, 2015

(65) Prior Publication Data

US 2017/0164490 A1 Jun. 8, 2017

(51) Int. Cl.
H05K 5/00 (2006.01)
H05K 7/14 (2006.01)
H01L 23/04 (2006.01)
H01L 23/24 (2006.01)
H01L 23/00 (2006.01)

(52) U.S. Cl.
CPC .......... *H05K 5/0056* (2013.01); *H01L 23/04* (2013.01); *H01L 23/24* (2013.01); *H05K 5/0082* (2013.01); *H05K 7/14* (2013.01); *B81B 2201/0264* (2013.01); *H01L 24/29* (2013.01); *H01L 24/32* (2013.01); *H01L 24/48* (2013.01); *H01L 24/49* (2013.01); *H01L 24/73* (2013.01); *H01L 2224/05553* (2013.01); *H01L 2224/05554* (2013.01); *H01L 2224/2919* (2013.01); *H01L 2224/32225* (2013.01); *H01L 2224/48091* (2013.01); *H01L 2224/48137* (2013.01); *H01L 2224/48472* (2013.01); *H01L 2224/49109* (2013.01); *H01L 2224/73265* (2013.01); *H01L 2924/00014* (2013.01); *H01L 2924/10158* (2013.01); *H01L 2924/15151* (2013.01); *H01L 2924/15153* (2013.01);
(Continued)

(58) Field of Classification Search
None
See application file for complete search history.

(56) References Cited

U.S. PATENT DOCUMENTS 5,050,498 A * 9/1991 Smith ............... B41F 15/08
101/127.1
5,054,193 A * 10/1991 Ohms ............... H05K 3/3415
269/21

(Continued)

OTHER PUBLICATIONS

International Search Report and Written Opinion dated Jan. 5, 2017 from corresponding International Patent Application No. PCT/US2016/056591.

*Primary Examiner* — Courtney L Smith
*Assistant Examiner* — Rashen E Morrison

(57) ABSTRACT

An automotive electronic device includes a pocket, which houses electronic components, bond wires connecting the electronic components, and a protective gel to encapsulate the electronic components and bond wires. A pocket cover has fins that protrude into the gel to reduce vibration of the gel and reduce vibration fatigue failure of the bond wires. The fins may: divide the gel into a plurality of cells; reduce the width of cells perpendicular to the bond wires; protrude deeper into the gel than the bond wires; and/or have differing shapes and/or depths.

7 Claims, 8 Drawing Sheets

(52) U.S. Cl.
CPC ............... *H01L 2924/16195* (2013.01); *H01L 2924/19105* (2013.01); *H01L 2924/19107* (2013.01)

(56) References Cited

U.S. PATENT DOCUMENTS

| | | | | |
|---|---|---|---|---|
| 5,060,114 A | * | 10/1991 | Feinberg | H01L 23/433 165/185 |
| 5,381,304 A | * | 1/1995 | Theroux | H05K 7/1417 174/521 |
| 5,586,388 A | * | 12/1996 | Hirao | H01L 21/4842 174/521 |
| 6,317,324 B1 | * | 11/2001 | Chen | H05K 7/20454 165/185 |
| 6,505,665 B1 | * | 1/2003 | Ulmer | H01L 24/27 156/382 |
| 6,787,893 B2 | * | 9/2004 | Nakajima | H01L 23/16 257/687 |
| 7,411,279 B2 | * | 8/2008 | Stoneham | H01L 23/552 257/531 |
| 8,245,575 B2 | | 8/2012 | Chiou et al. | |
| 2002/0100331 A1 | * | 8/2002 | Imai | G01L 19/0069 73/753 |
| 2003/0011057 A1 | * | 1/2003 | Nakajima | H01L 23/16 257/678 |
| 2004/0014337 A1 | * | 1/2004 | Throum | H05K 5/0013 439/76.1 |
| 2006/0250756 A1 | * | 11/2006 | Sugimoto | H05K 3/284 361/600 |
| 2008/0091326 A1 | * | 4/2008 | Watanabe | B60T 13/741 701/70 |
| 2010/0230805 A1 | | 9/2010 | Refai-Ahmed | |
| 2011/0026226 A1 | * | 2/2011 | Zheng | H05K 7/209 361/709 |
| 2011/0216487 A1 | * | 9/2011 | Sakai | H05K 7/20863 361/679.01 |
| 2011/0232389 A1 | * | 9/2011 | Chiou | G01L 9/0052 73/721 |
| 2014/0028243 A1 | * | 1/2014 | Rayner | G06F 1/163 320/103 |
| 2014/0110801 A1 | | 4/2014 | Higgins, III | |
| 2014/0230763 A1 | * | 8/2014 | Watanabe | F01L 1/344 123/90.15 |
| 2016/0081197 A1 | * | 3/2016 | Arvelo | H01L 23/34 29/832 |

* cited by examiner

-PRIOR ART-

-- PRIOR ART --

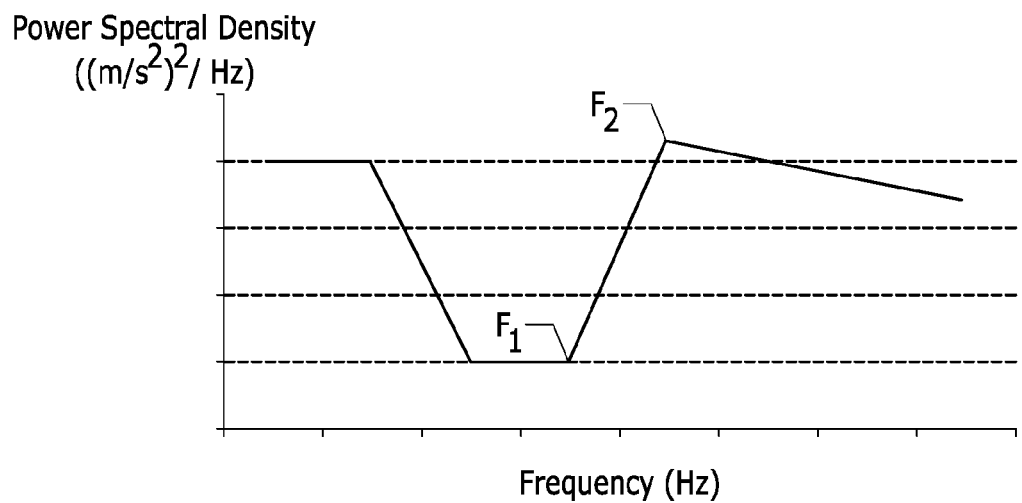
Figure 4
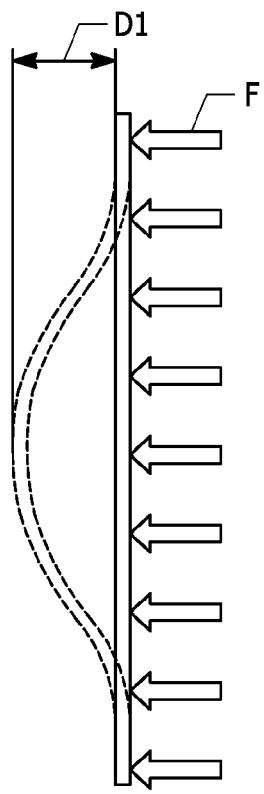
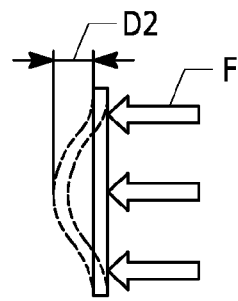
Figure 5A            Figure 5B

AUTOMOTIVE ELECTRONIC DEVICE HAVING A COVER WITH FINS TO REDUCE GEL VIBRATION

BACKGROUND

Bond wire vibration fatigue failure is a problem for certain automotive electronic devices, including, but not limited to, various types of sensors, such as pressure sensors.

For example, FIG. 1 depicts a transmission-fluid pressure sensor 100 in accordance with the prior art. The transmission-fluid pressure sensor includes a housing 102. The bond wires for electrical connections are located in a pocket 104 with a high density protection gel encapsulating them. During operation of an automobile, bond wires of this type may encounter vibration fatigue failure.

FIG. 1 also depicts a cover 106 for the pocket 104. The cover includes a rim 108.

FIG. 2 is a top view of the pocket 104. Eighteen bond wires 202 are shown in FIG. 2. Also in the pocket are printed circuit board (PCB) 204, application-specific integrated circuits (ASICs) 208 and 210, chip capacitors 206, and pressure sensing elements 212.

FIG. 3 is a cross-sectional view, along sectional view line I-I of FIG. 2, of the housing pocket 104 and the cover 106. The pressure sensing element 212 is electrically coupled to the ASIC 210 by bond wires 202-1, which are attached to bond pads on the pressure sensing element 212 and on the ASIC 210. Similarly, the ASIC 210 is electrically coupled to the PCB 204 by bond wires 202-2, which are attached to bond pads on the ASIC 210 and the PCB 204. And the PCB 204 is electrically coupled to a lead frame 318 by bond wires 202-3, which are attached to bond pads on the PCB 204 and to the lead frame 318. Chip capacitors 206 are used for electromagnetic compatibility (EMC) by coupling electrical signals between the wires 202-2 and 202-3 through metal traces (not shown) in the PCB 204 and electrically conductive adhesive (ECA) or solder 316 on the PCB 204.

Other components shown in FIG. 3 include: a glass cap 302, a vacuum cavity 304, a glass pedestal 308, gel 306, transmission-fluid pressure 310, ambient pressure 311, epoxy 312, and adhesive 314.

FIG. 4 is a log-log-scaled graphical depiction of the power spectral density impressed on a bond wire of a transmission-fluid pressure sensor by random vibration as a function of the frequency of wave fronts. FIG. 4 shows a random vibration example in a log-log scale. As the frequency increases above a critical value F1, the power spectral density on a bond wire increases linearly to a second frequency F2. At frequencies above F2, random-vibration-induced power spectral density gradually decreases linearly.

FIGS. 5A and 5B depict pressure or forces on bond wires from vibration-induced wave fronts. FIGS. 5A and 5B are graphical depictions of the forces exerted on a "long" bond wire and a "short" bond wire. Lateral forces from the wave fronts are distributed over the length of the wire and represented in the figures by the arrows identified by "F." While the wave fronts can strike the wires at any angle, the force that is orthogonal to the wire's axial length is the force that tends to break the wire and/or its bond due to the lateral displacements D1 and D2 that a force normal to the wire's axis tends to cause.

As is well known, the total force F exerted on a surface of area A, by a pressure of magnitude P acting uniformly over the entire area, is the product of P and A. In other words, $$F = P * A$$

where F is the force on an area A under a uniform pressure P.

In the pocket 104, since the gel edge is considered herein to be essentially "anchored" to the sidewall, the wave front pressure P in the horizontal direction is proportional to the gel acceleration a multiplied by the gel density ρ times the "width" of the gel W, which is the width of the pocket 104. Stated another way, $$P \propto \rho \times a \times W$$

where ρ is the density of the gel 306, a is the acceleration of the gel and W is the "width" of the gel, perpendicular to the wire inside the pocket 104.

FIGS. 5A and 5B show that for a given wave-front pressure, the total force exerted on a "long" bond wire will be greater than the total force exerted on a "short" bond wire. The wave fronts that strike long bond wires thus tend to cause such wires and/or their connections to fail.

A method and/or apparatus to reduce vibration-induced wave fronts in a pocket 104 containing the gel 306 would be an improvement over the prior art in that reducing wave fronts would tend to reduce bond wire failure as well as reduce bond wire connection failure.

BRIEF SUMMARY

Embodiments of the invention are directed to an automotive electronic device that includes a pocket that houses: electronic components, bond wires connecting the electronic components, and a protective gel. A pocket cover has fins that protrude into the gel to reduce vibration of the gel and vibration fatigue failure of the bond wires. The fins may: divide the gel into a plurality of cells; reduce the width of cells perpendicular to the bond wires; protrude deeper into the gel than the bond wires; and/or have differing shapes and/or depths. Embodiments of the invention are also directed to associated methods.

BRIEF DESCRIPTION OF THE DRAWINGS

FIG. 4 is a graphical depiction of the power spectral density impressed on a bond wire of the transmission-fluid pressure sensor by random vibration.

FIGS. 5A and 5B depict forces on bond wires from vibration-induced wave fronts.

DETAILED DESCRIPTION

An embodiment of the invention is directed to a medium pressure sensor (e.g., approximately 1 MPa to approximately 5 MPa) such as a transmission-fluid pressure sensor. Other embodiments may be directed to various other types of automotive electronic devices that contain bond wires and protective gel; e.g., a transmission control module.

Figure 1:
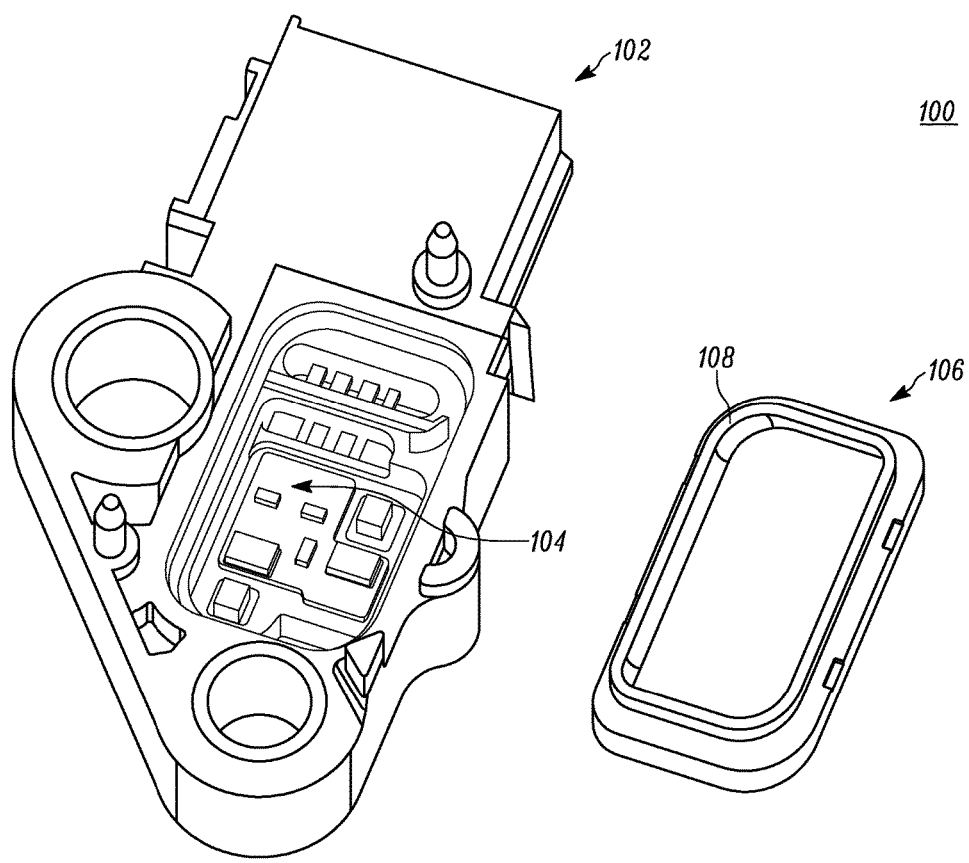
FIG. 1 depicts a transmission-fluid pressure sensor in accordance with the prior art.
Figure 2:
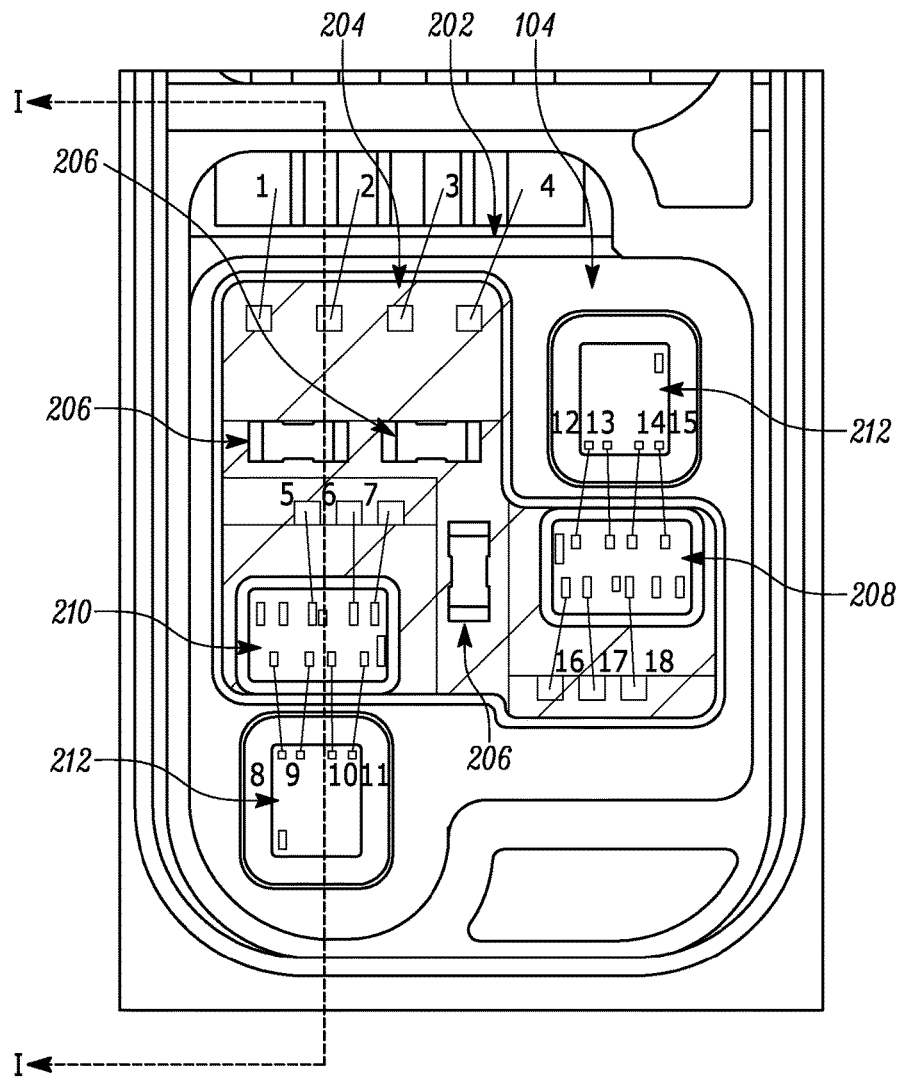
FIG. 2 is a top view of the pocket shown FIG. 1.
Figure 3:
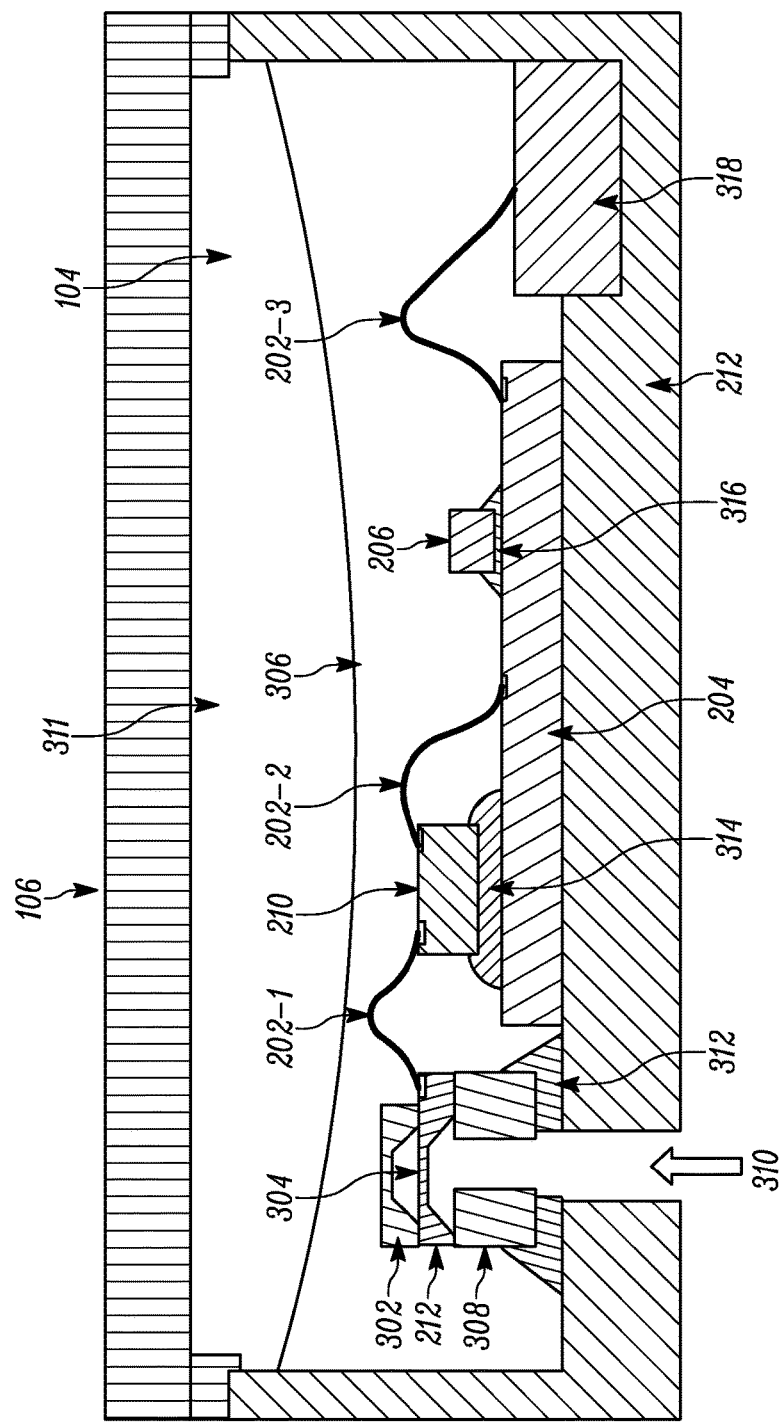
FIG. 3 is a cross-sectional view of the housing pocket and cover.
Figure 6A:
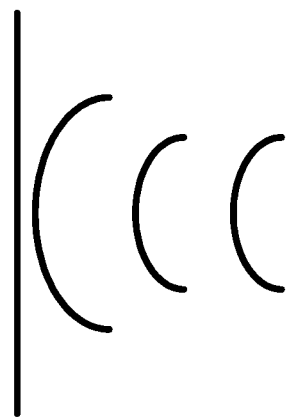
FIGS. 6A and 6B show pressure waves moving perpendicular, and parallel to a bond wire.
Figure 6B:
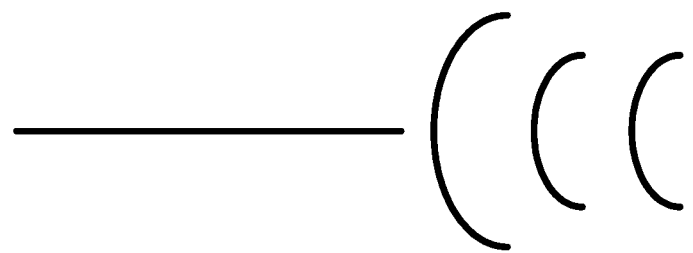

FIGS. 6A and 6B show pressure waves moving perpendicular, and parallel, respectively, to a bond wire. Pressure waves moving perpendicular to the wire produce a much higher risk of wire failure than do pressure waves moving parallel to the wire.

Pressure P on a bond wire is proportional to the gel density ρ multiplied by the gel acceleration a times the width of gel W, which is the width of the pocket perpendicular to the bond wire.

The bending stress acting on a bond wire is proportional to the bond wire length squared.

In order to reduce gel vibration and prevent bond wire fatigue failures, a cover with fins may be used to divide the gel into a plurality of cells. The cover may be made of plastic or any other suitable material.

Figure 7:
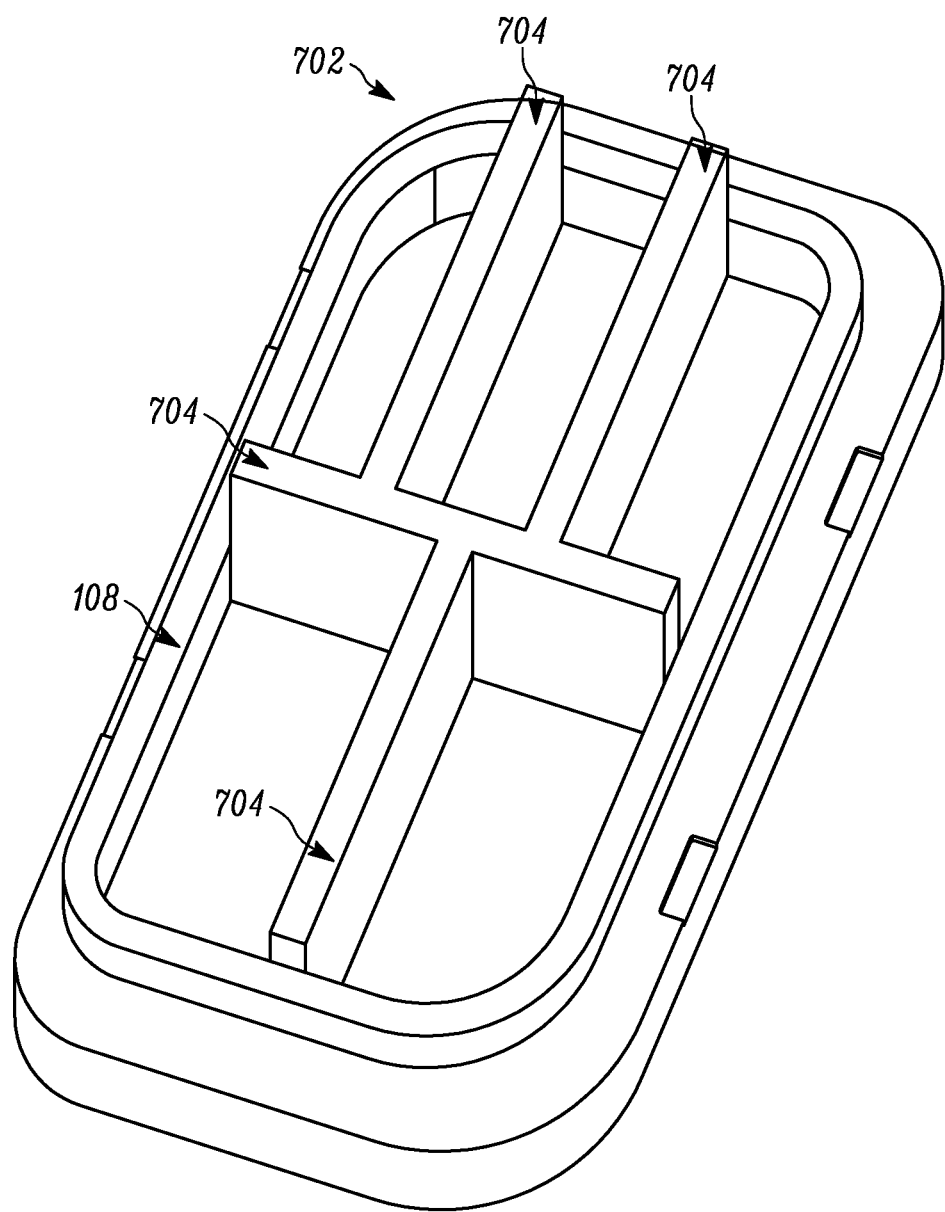
FIG. 7 depicts a cover with fins in accordance with embodiments of the invention.

FIG. 7 depicts a cover 702 with fins 704 in accordance with embodiments of the invention. FIG. 7 is perspective view of the bottom of the cover from which a rim 108 and several rectangular fins 704 protrude.

Figure 8:
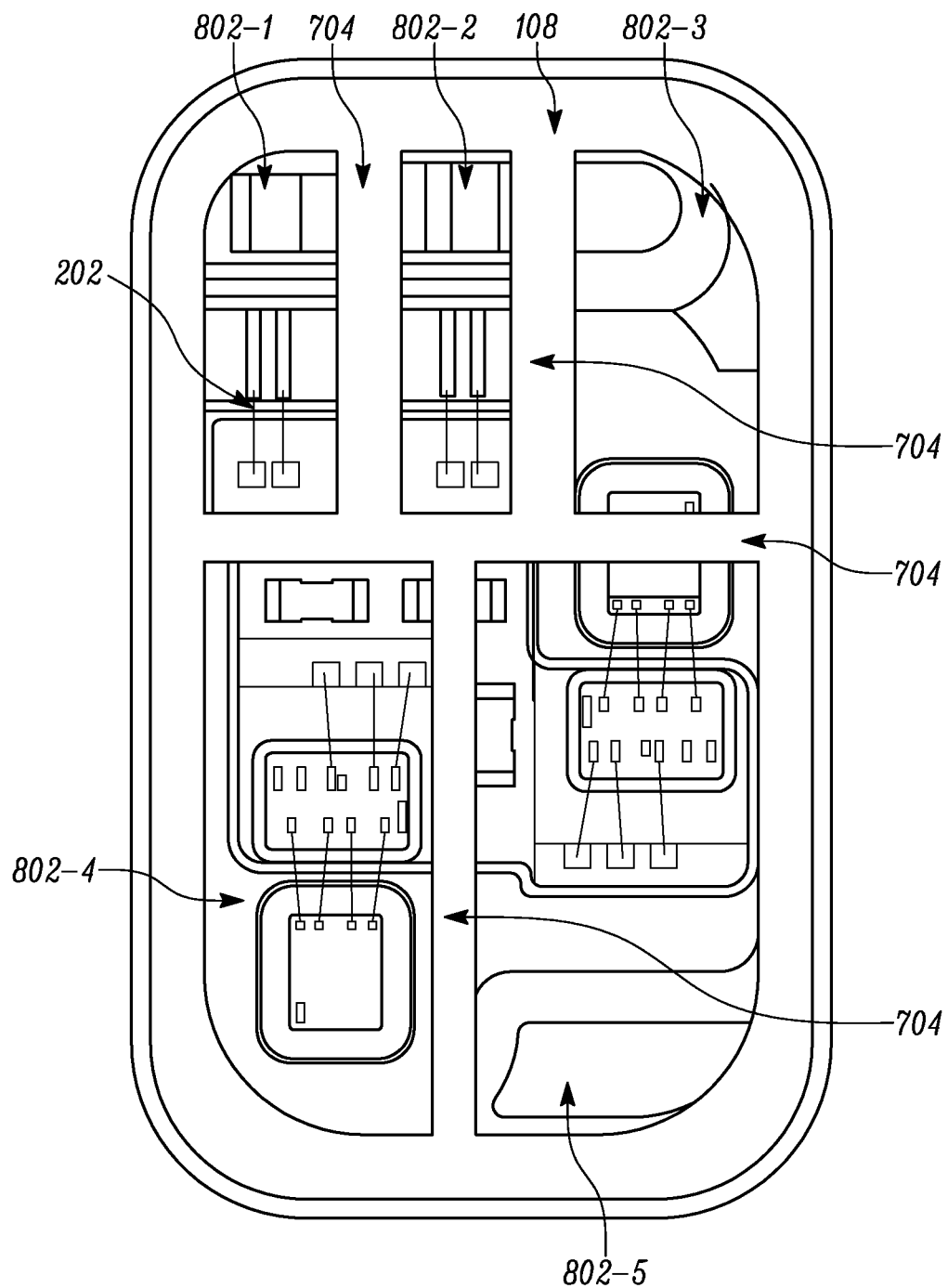
FIG. 8 is a top sectional view through the cover shown in FIG. 7 showing fins that form cells to reduce the width of the pocket in which pressure waves can travel.

FIG. 8 is a top sectional view through the cover 702 showing fins 704 that form cells 802-1 through 802-5 to reduce the width of the pocket in which pressure waves can travel perpendicularly to the bond wires. Fins 802-1 through 802-3 are formed above the horizontal fin 704 in FIG. 8 and are divided by the two fins that run vertically up from the horizontal fin in FIG. 8 to the rim 108 of the cover 702. Cells 802-4 and 802-5 are formed below the horizontal fin 704 in FIG. 8 and are divided by the single fin that runs vertically down in FIG. 8 from the horizontal fin to the rim 108.

Figure 9:
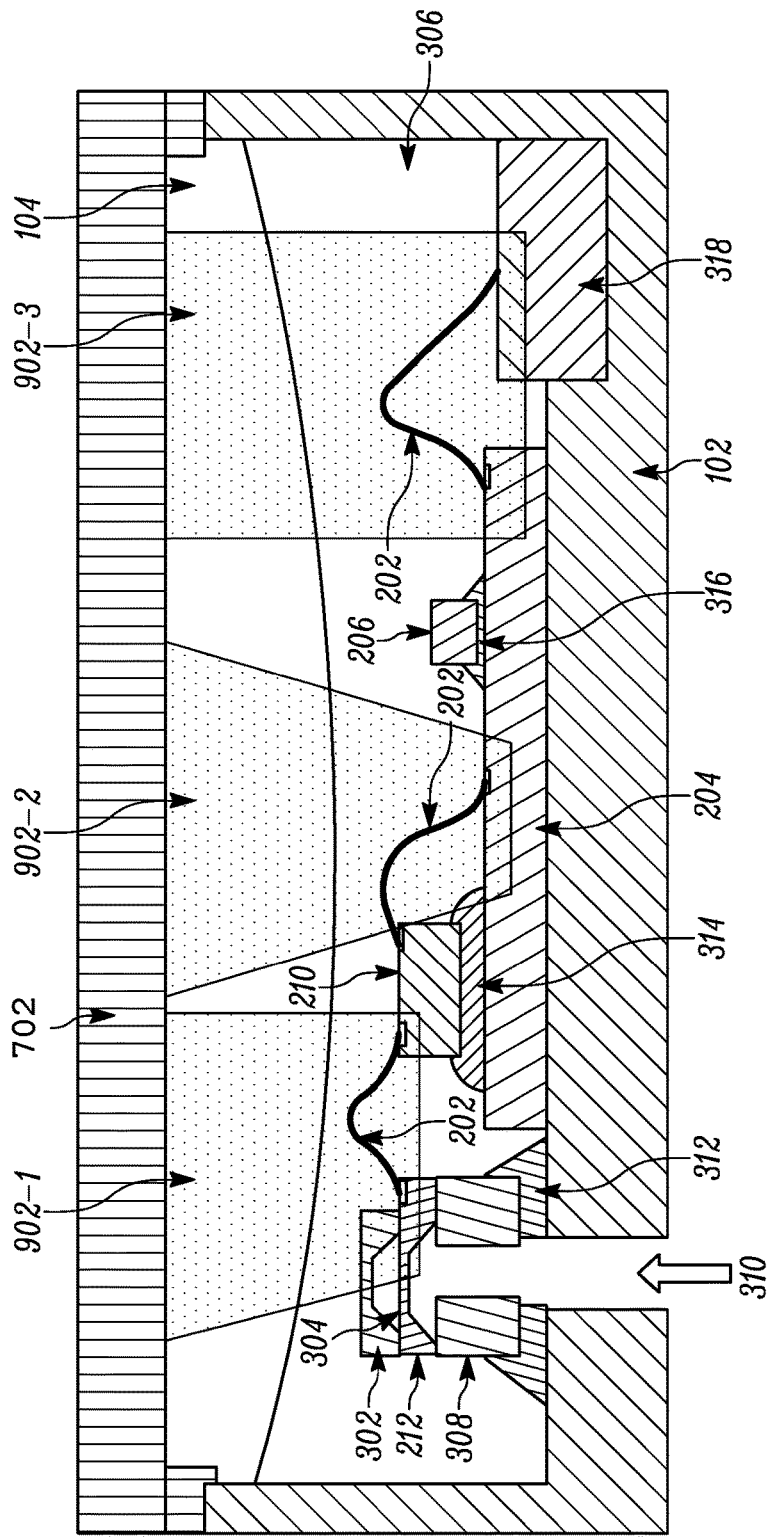
FIG. 9 is a sectional side view of the cavity showing fins in accordance with embodiments of the invention.

FIG. 9 is a sectional side view of the cavity showing fins in accordance with embodiments of the invention. Fins 902-1, 902-2, and 902-3 are shown in various shapes, such as rectangular 902-3 and trapezoidal 902-1 and 902-2, and having varying depths, such as shallow 902-1 and deep 902-2 and 902-3. The fins are configured to protect the bond wires 202 from perpendicular pressure waves, which would otherwise travel in directions that can be referred to as "into or out of the page" with reference to the view shown in FIG. 9.

In the embodiment of FIG. 9, there is no short wall between the PCB 204 and lead frame 318. Also, a slightly wider pocket (or slightly narrower PCB) is used with a slot between the PCB and housing side wall. The deep fins, 902-2 and 902-3, therefore, can be more deeply inserted into the gel. For example, deep fin 902-2 extends deeper into the gel than the top surface of the PCB, and deep fin 902-3 extends deeper into the gel than the top surfaces of the PCB and the lead frame.

In accordance with embodiments of the invention, fins protrude from the pocket cover into the gel thereby dividing the gel into a plurality of cells and reducing the gel mass and gel movement in each cell during vibration. Further, gel movement is reduced by increasing friction between the gel and fin walls as compared to the amount of gel movement in the absence of fins.

By using fins protruding downwardly from the bottom of the cover 106, as opposed to breakwaters, of the type disclosed by U.S. Pat. No. 8,245,575 to Chiou et al., that protrude from within the pocket 104, increased flexibility is provided with respect to placement of both the components within the pocket and also with respect to placement of the fins in response to placement of the components within the pocket. For example, use of the PCB as depicted in FIG. 8 would preclude use of breakwaters to protect the bond wires shown in FIG. 8.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

The invention claimed is:

1. An automotive electronic device comprising:
    a housing having a pocket;
    a circuit board in the pocket and a plurality of electronic components attached to the circuit board;
    a plurality of bond wires in the pocket and which are connected to electronic components on the circuit board;
    a gel in the pocket, the gel encapsulating electronic components and bond wires that are in the pocket; and
    a pocket cover having a plurality of fins that are located inside the pocket and which extend downwardly from a bottom surface of the pocket cover into the gel, first and second fins being substantially orthogonal to each other and substantially orthogonal to the pocket cover and configured to constrain movement of the gel in first and second orthogonal directions;
    wherein the pocket cover comprises a top surface, an opposing bottom surface, first and second substantially parallel and opposing sides that extend downwardly from the bottom surface of the pocket cover into the gel, and third and fourth substantially parallel and opposing sides that also extend downwardly from the bottom surface of the pocket cover into the gel, both of the first and second substantially parallel and opposing sides being substantially orthogonal to both of the third and fourth substantially parallel and opposing sides.

2. The automotive electronic device of claim 1, wherein the plurality of fins divide the pocket into a plurality of cells, each cell having gel therein.

3. The automotive electronic device of claim 1, wherein a first fin of the plurality of fins has a first depth, and a second fin of the plurality of fins has a second depth that is different from the first depth.

4. The automotive electronic device of claim 1, wherein at least one of the fins is a substantially rectangular parallelepiped.

5. The automotive electronic device of claim 1, wherein at least one of the fins has a cross sectional shape that is substantially trapezoidal.

6. The automotive electronic device of claim 1, wherein the automotive electronic device is a pressure sensor, having a hole through which fluid can flow to a pressure sensing element in the pocket.

7. The automotive electronic device of claim 1, wherein the at least first and second fins are connected to each other.

* * * * *